United States Patent
Kang et al.

(10) Patent No.: US 12,068,015 B2
(45) Date of Patent: Aug. 20, 2024

(54) MEMORY DEVICE INCLUDING MERGED WRITE DRIVER

(71) Applicant: SAMSUNG ELECTRONICS CO., LTD., Suwon-si (KR)

(72) Inventors: Gyuseong Kang, Goyang-si (KR); Hyuntaek Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 198 days.

(21) Appl. No.: 17/894,554

(22) Filed: Aug. 24, 2022

(65) Prior Publication Data

US 2023/0154517 A1     May 18, 2023

(30) Foreign Application Priority Data

Nov. 15, 2021  (KR) .......................... 10-2021-0157075
Mar. 2, 2022   (KR) .......................... 10-2022-0026967

(51) Int. Cl.
*G11C 8/10*     (2006.01)
*G11C 11/16*    (2006.01)

(52) U.S. Cl.
CPC ............ *G11C 11/1675* (2013.01); *G11C 8/10* (2013.01); *G11C 11/1655* (2013.01); *G11C 11/1657* (2013.01)

(58) Field of Classification Search
CPC ... G11C 11/1675; G11C 8/10; G11C 11/1655; G11C 11/1657; G11C 29/54; G11C 29/021; G11C 29/028; G11C 29/12005; G11C 2013/0088; G11C 2013/0092; G11C 2213/79; G11C 13/0026; G11C 8/08; G11C 13/0069; G11C 11/165; G11C 11/1697
See application file for complete search history.

(56) References Cited

U.S. PATENT DOCUMENTS

| | | | |
|---|---|---|---|
| 7,894,236 B2 | 2/2011 | Oh et al. | |
| 8,050,109 B2 | 11/2011 | Yan et al. | |
| 8,320,196 B2 | 11/2012 | Yan et al. | |
| 9,076,507 B2 | 7/2015 | Kim et al. | |
| 10,515,697 B1 | 12/2019 | Jain et al. | |
| 10,699,763 B2 | 6/2020 | Hao et al. | |
| 2007/0182451 A1 | 8/2007 | Kim | |
| 2013/0021844 A1 | 1/2013 | Pyeon | |
| 2018/0342277 A1* | 11/2018 | Wei ..................... G11C 13/0069 |

FOREIGN PATENT DOCUMENTS

KR          10-0845796 B1     7/2008

* cited by examiner

*Primary Examiner* — Xiaochun L Chen
(74) *Attorney, Agent, or Firm* — Muir Patent Law, PLLC

(57) ABSTRACT

A memory device including a memory cell array including a first sub memory cell array including a first memory cell and a second sub memory cell array including a second memory cell, a merged write driver including a first write circuit receiving n-bit data (n being a natural number ≥2) through a write input/output line, outputting a first write voltage to a merged node in response to a first data bit of the n-bit data, and outputting a second write voltage to the merged node in response to a second data bit of the n-bit data, and a column decoder including a first column multiplexer applying a first voltage of the merged node corresponding to the first data bit to the first memory cell and a second column multiplexer applying a second voltage of the merged node corresponding to the second data bit to the second memory cell.

20 Claims, 14 Drawing Sheets

MEMORY DEVICE INCLUDING MERGED WRITE DRIVER

CROSS-REFERENCE TO RELATED APPLICATIONS

This application claims priority under 35 U.S.C. § 119 to Korean Patent Application Nos. 10-2021-0157075, filed on Nov. 15, 2021, and 10-2022-0026967, filed on Mar. 2, 2022, in the Korean Intellectual Property Office, the disclosures of which are incorporated by reference herein in their entireties.

BACKGROUND

1. Field

Embodiments relate to a memory device including a merged write driver.

2. Description of the Related Art

A semiconductor memory device may be classified as a volatile memory device, in which stored data disappear when a power supply is turned off, such as a static random access memory (SRAM) or a dynamic random access memory (DRAM), or a nonvolatile memory device, in which stored data are retained even when a power supply is turned off, such as a flash memory device, a phase-change RAM (PRAM), a magnetic RAM (MRAM), a resistive RAM (RRAM), or a ferroelectric RAM (FRAM).

SUMMARY

According to an embodiment, a memory device may include a memory cell array that includes a first sub memory cell array including a first memory cell and a second sub memory cell array including a second memory cell, a merged write driver that includes a first write circuit receiving n-bit data (n being a natural number of 2 or more) through a write input/output line, outputting a first write voltage to a merged node in response to a first data bit of the n-bit data, and outputting a second write voltage to the merged node in response to a second data bit of the n-bit data, and a column decoder that includes a first column multiplexer applying a first voltage of the merged node corresponding to the first data bit to the first memory cell and a second column multiplexer applying a second voltage of the merged node corresponding to the second data bit to the second memory cell.

According to an embodiment, a memory device may include a memory cell array that includes a first sub memory cell array including a first memory cell and a second sub memory cell array including a second memory cell, a column decoder that includes a first column multiplexer applying a first voltage of a first merged node corresponding to a first value or a second voltage of a second merged node corresponding to a second value to a first memory cell, and a second column multiplexer applying the first voltage of the first merged node corresponding to the first value or the second voltage of the second merged node corresponding to the second value to a second memory cell, and a merged write driver that receives "n" data bits (n being a natural number of 2 or more) through a write input/output line, and provides the column decoder with the first voltage or the second voltage in response to the n-bit data. The merged write driver may include first write circuits each outputting a first write voltage to the first merged node in response to a first data bit corresponding to the first value from among the "n" data bits, and second write circuits each outputting a second write voltage to the second merged node in response to a second data bit corresponding to the second value from among the "n" data bits.

According to an embodiment, a memory device may include a memory cell array that includes a first sub memory cell array including a first memory cell and a second sub memory cell array including a second memory cell, a column decoder that includes a first column multiplexer providing a first current corresponding to a first value or a first voltage of a first merged node corresponding to a second value to the first memory cell, and a second column multiplexer providing a second current corresponding to the first value or the first voltage of the first merged node corresponding to the second value to the second memory cell, and a merged write driver that receives "n" data bits (n being a natural number of 2 or more) through a write input/output line and provides the column decoder with the first current, the second current, or the first voltage in response to the n-bit data. The merged write driver may include a first current write circuit that provides the first current to the first column multiplexer in response to a first data bit corresponding to the first value from among the "n" data bits, a second current write circuit that provides the second current to the second column multiplexer in response to a second data bit corresponding to the first value from among the "n" data bits, and a second write circuit that outputs a write voltage to a second merged node in response to a third data bit corresponding to the second value from among the "n" data bits.

BRIEF DESCRIPTION OF THE DRAWINGS

Features will become apparent to those of skill in the art by describing in detail example embodiments with reference to the attached drawings in which.

DETAILED DESCRIPTION

Figure 1:
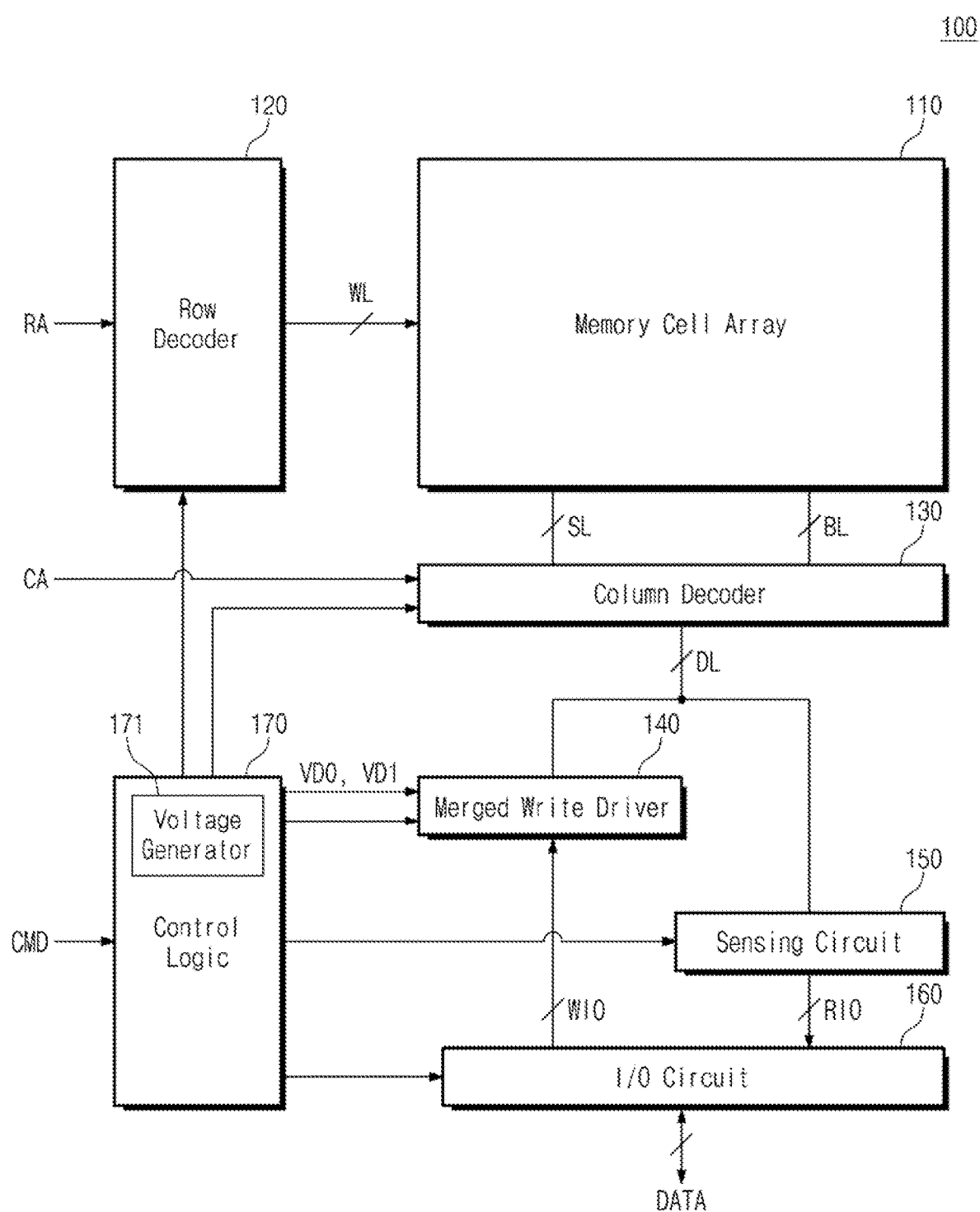
FIG. 1 is a block diagram illustrating a memory device according to an example embodiment.

FIG. 1 is a block diagram illustrating a memory device according to an example embodiment.

According to an example embodiment, a memory device 100 may include a memory cell array 110, a row decoder 120, a column decoder 130, a merged write driver 140, a sensing circuit 150, an input/output circuit 160, and control logic 170.

The memory cell array 110 may include a plurality of memory cells each configured to store data. For example, each memory cell may include a variable resistance element, and a value of data stored therein may be determined based on a resistance value of the variable resistance element. For example, each memory cell may include an MRAM (Magneto-resistive RAM) cell, an STT-MRAM (Spin Transfer Torque MRAM) cell, a PRAM (Phase-change RAM) cell, a ReRAM (Resistive RAM) cell, or the like. Herein, some examples will be given for a case in which each memory cell includes an MRAM cell.

The memory cells constituting the memory cell array 110 may be connected with source lines SL, bit lines BL, and word lines WL. For example, memory cells arranged along a row may be connected in common with a word line corresponding to the row, and memory cells arranged along a column may be connected in common with a source line and a bit line corresponding to the column.

Under control of the control logic 170, the row decoder 120 may select (or drive) the word line WL connected with a memory cell targeted for a read operation or a write (or program) operation, based on a row address RA. The row decoder 120 may provide the selected word line with a driving voltage supplied from the control logic 170. For example, the row decoder 120 may apply a selection voltage for read or write to a selected word line and may apply a non-selection voltage (or voltages) for read or write inhibition to unselected word lines.

Under control of the control logic 170, the column decoder 130 may select the bit line BL and/or the source line SL connected with the memory cell targeted for the read operation or the write operation, based on a column address CA. Under control of the control logic 170, the column decoder 130 may apply bias voltages to unselected source lines and unselected bit lines. The bias voltages may be determined to have no influence on the read operation or the write operation associated with selected memory cells connected with the selected word line, selected bit lines, and selected source lines, and may include, e.g., a ground voltage.

In the write operation, the merged write driver 140 may drive a write voltage (or a write current) for storing write data in a memory cell selected by the row decoder 120 and the column decoder 130. For example, in the write operation of the memory device 100, the merged write driver 140 may store the write data in the selected memory cell by controlling a voltage of a data line DL based on the write data provided from the input/output circuit 160 through a write input/output line (hereinafter referred to as a "write I/O") WIO.

The data line DL is illustrated for convenience of description and brevity of drawing, but the data line DL may be understood as corresponding to the bit line BL and the source line SL selected by the column decoder 130.

In the read operation, the sensing circuit 150 may sense a signal output through the data line DL to determine a value of data stored in the selected memory cell. The sensing circuit 150 may be connected with the column decoder 130 through the data line DL, and may be connected with the input/output circuit 160 through a read input/output line RIO. The sensing circuit 150 may output the sensed read data to the input/output circuit 160 through the read input/output line RIO.

In an example embodiment, the data line DL may be connected with a bit line or a source line that is selected by the column decoder 130. Thus, in the read operation of the memory device 100, as the sensing circuit 150 senses a signal provided through the data line DL, read data may be read from a memory cell corresponding to a bit line or source line selected by the column decoder 130. In the write operation of the memory device 100, as the merged write driver 140 controls a voltage of the data line DL based on write data, the write data DIN may be written in a memory cell corresponding to a bit line or a source line selected by the column decoder 130.

For example, when intending to change data of a specific memory cell, the merged write driver 140 may provide a write voltage to one of a source line and a bit line connected to the specific memory cell, and may provide a low voltage, e.g., the ground voltage, to the other thereof.

The input/output circuit 160 may exchange data "DATA" with an external device (e.g., a memory controller) under control of the control logic 170. For example, in the write operation, the input/output circuit 160 may provide the data "DATA" received from the external device to the merged write driver 140. In the read operation, the input/output circuit 160 may output the data "DATA" transferred from the sensing circuit 150 to the external device.

The control logic 170 may control an operation of the memory device 100 in response to a command CMD from the external device. For example, the control logic 170 may activate the merged write driver 140 in the write operation of the memory device 100; the control logic 170 may activate the sensing circuit 150 in the read operation of the memory device 100

The control logic 170 may include a voltage generator 171. The voltage generator 171 may generate a first driving voltage VD0 and a second driving voltage VD1 in the write operation. The first and second driving voltages VD0 and VD1 may be supplied to the merged write driver 140. The first and second driving voltages VD0 and VD1 may be used for the merged write driver 140 to generate a write voltage.

Figure 2:
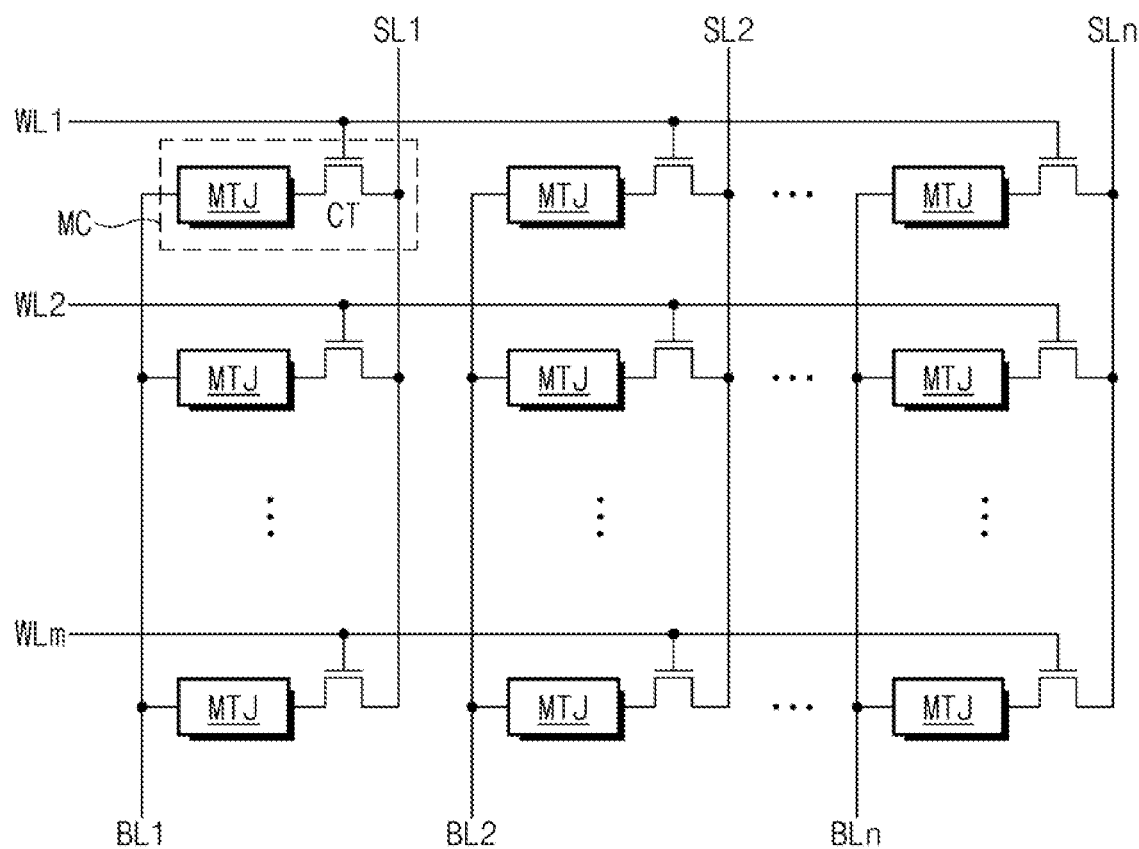
FIG. 2 is a circuit diagram illustrating a configuration of a memory cell array of FIG. 1.

FIG. 2 is a circuit diagram illustrating a configuration of a memory cell array of FIG. 1.

Referring to FIGS. 1 and 2, the memory cell array 110 may include a plurality of memory cells arranged in row and column directions. In an example embodiment, in FIG. 2, one memory cell MC of the plurality of memory cells is marked by a dotted box. Each memory cell MC may include a magnetic tunnel junction (MTJ) element and a cell transistor CT. As the MTJ element of each memory cell MC is programmed to have a specific resistance value, data corresponding to the specific resistance value may be stored in each memory cell MC.

The plurality of memory cells may be connected with word lines WL1 to WLm, bit lines BL1 to BLn, and source lines SL1 to SLn. In the memory cell MC, a first end of the MTJ element may be connected with the first bit line BL1, and a second end of the MTJ element may be connected with a first end of the cell transistor CT. A second end of the cell transistor CT may be connected with the first source line SL1, and a gate electrode of the cell transistor CT may be connected with the first word line WL1.

Figure 3A:
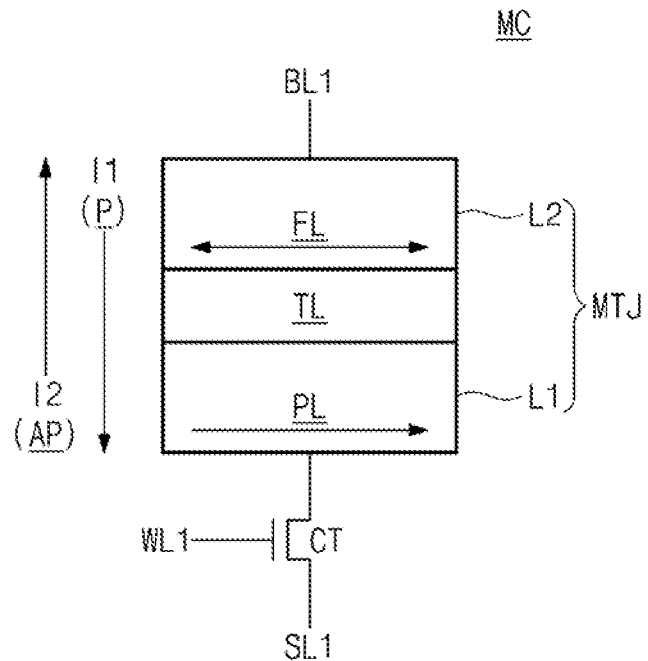
FIGS. 3A and 3B are circuit diagrams illustrating a configuration of a memory cell of FIG. 2.
Figure 3B:
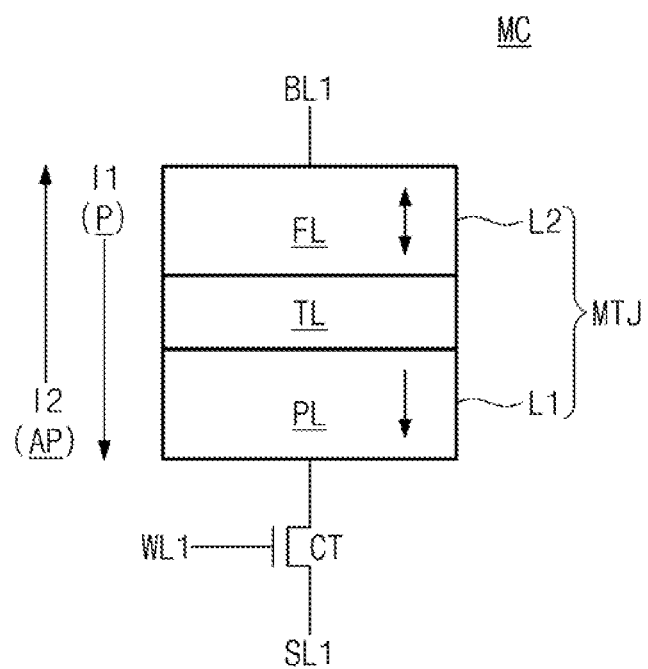

FIGS. 3A and 3B are circuit diagrams illustrating a configuration of a memory cell of FIG. 2.

Referring to FIGS. 3A and 3B, the MTJ element may include a pinned layer PL, a tunneling layer TL, and a free layer FL. The tunneling layer TL may include a nonmagnetic material. For example, the tunneling layer TL may include one or more of magnesium (Mg) oxide, titanium (Ti) oxide, aluminum (Al) oxide, magnesium-zinc (Mg—Zn) oxide, or magnesium-boron (Mg—B) oxide, or a combination thereof. In an example embodiment, a thickness of the tunneling layer TL may be smaller than a thickness of a spin diffusion distance. Each of the pinned layer PL and the free layer FL may include at least one magnetic layer.

In detail, the pinned layer PL may include a magnetic layer having a magnetization direction fixed in a specific direction, and the free layer FL may include a magnetic layer having a magnetization direction capable of changing to be parallel or anti-parallel to the magnetization direction of the pinned layer PL.

In an example embodiment, referring to FIG. 3A, magnetization directions may be mostly parallel to an interface of the tunneling layer TL and the pinned layer PL. In this case, each of the pinned layer PL and the free layer FL may include a ferromagnetic material. For example, each of the pinned layer PL and the free layer FL may include one or more of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$. In an example embodiment, the pinned layer PL may further include an anti-ferromagnetic material for fixing a magnetization direction of the ferromagnetic material. For example, the pinned layer PL may include one or more of PtMn, IrMn, MnO, MnS, MnTe, $MnF_2$, $FeCl_2$, FeO, $CoCl_2$, CoO, $NiCl_2$, NiO, or Cr.

In an example embodiment, referring to FIG. 3B, magnetization directions may be mostly perpendicular to an interface of the tunneling layer TL and the pinned layer PL. In this case, each of the tunneling layer TL and the pinned layer PL may include one or more of a perpendicular magnetic material (e.g., CoFeTb, CoFeGd, or CoFeDy), a perpendicular magnetic material with L10 structure, a CoPt-based material with a hexagonal-close-packed lattice structure, and a perpendicular magnetic structure, or a combination thereof. The perpendicular magnetic material with L10 structure may include one or more of FePt with L10 structure, FePd with L10 structure, CoPd with L10 structure, or CoPt with L10 structure, or a combination thereof. The perpendicular magnetic structure may include magnetic layers and non-magnetic layers that are alternately and repeatedly stacked. For example, the perpendicular magnetic structure may include one or more of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, in which "n" is the number of stacked layers, or a combination thereof.

In an example embodiment, when a voltage of a relatively high level is applied to the bit line BL1 and a voltage of a relatively low level is applied to the source line SL1, a write current I1 may flow. In this case, a magnetization direction of the free layer FL may be identical to a magnetization direction of the pinned layer PL, and thus, the MTJ element may have a low resistance value (i.e., a parallel (P) state).

In contrast, when a voltage of a relatively high level is applied to the source line SL1 and a voltage of a relatively low level is applied to the bit line BL1, a write current I2 may flow. In this case, a magnetization direction of the free layer FL may be opposite to a magnetization direction of the pinned layer PL, and thus, the MTJ element may have a great resistance value (i.e., an anti-parallel (AP) state). Thus, a resistance value of the anti-parallel state may be greater than a resistance value of the parallel state.

In an example embodiment, in the case where the MTJ element is in the parallel state, the memory cell MC may be regarded as storing data of a first value (e.g., logic "0"). In contrast, in the case where the MTJ element is in the anti-parallel state, the memory cell MC may be regarded as storing data of a second value (e.g., logic "1").

Figure 4:
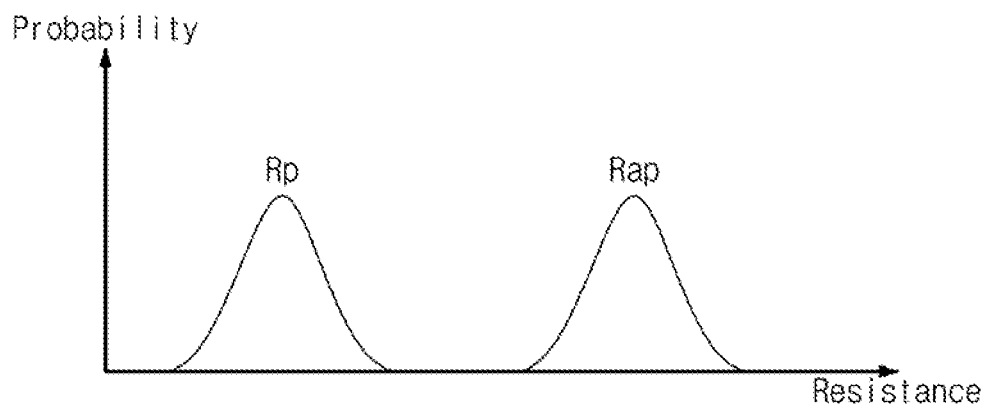
FIG. 4 illustrates a graph associated with a program state of a memory cell of FIGS. 3A and 3B.

FIG. 4 illustrates a graph associated with a program state of a memory cell of FIGS. 3A and 3B.

Referring to FIGS. 1 to 3B and 4, in the case where the variable resistance element MTJ is in the anti-parallel state, the variable resistance element MTJ may have an anti-parallel resistance value Rap; in the case where the variable resistance element MTJ is in the parallel state, the variable resistance element MTJ may have a parallel resistance value Rp. Thus, data may be stored in the memory cell MC depending on a resistance value of the variable resistance element MTJ, and the data stored in the memory cell MC may be read by determining the resistance value of the variable resistance element MTJ.

Figure 5:
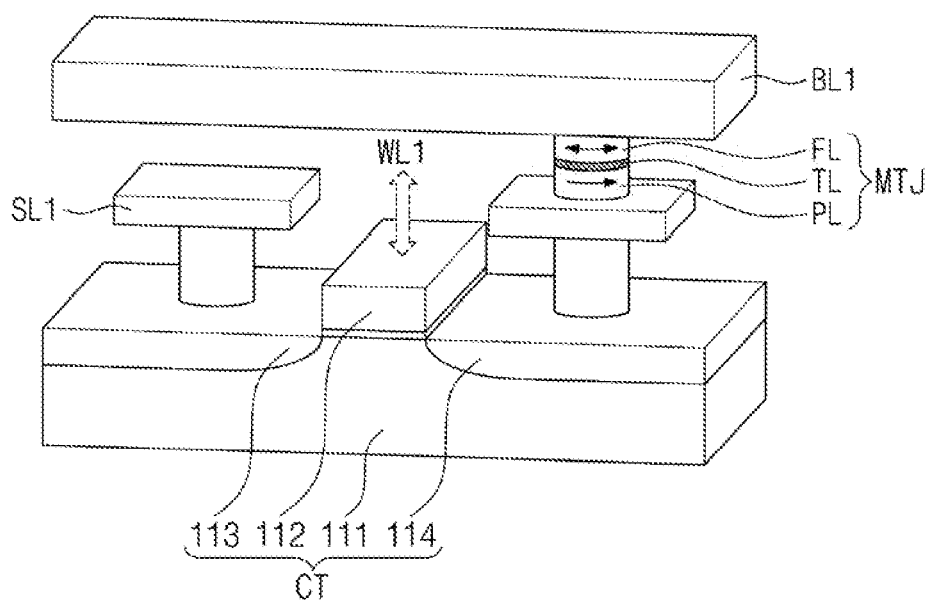
FIG. 5 is a conceptual diagram illustrating a configuration of a memory cell of FIG. 3A.

FIG. 5 is a conceptual diagram illustrating a configuration of a memory cell of FIG. 3A.

The cell transistor CT may include a body substrate 111, a gate electrode 112, and junctions 113 and 114. The junction 113 may be formed on the body substrate 111, and may be connected with the source line SL1. The junction 114 may be formed on the body substrate 111, and may be connected with the bit line BL1 through the MTJ element. The gate electrode 112 may be formed on the body substrate 111 between the junctions 113 and 114, and may be connected with the word line WL1.

Figure 6:
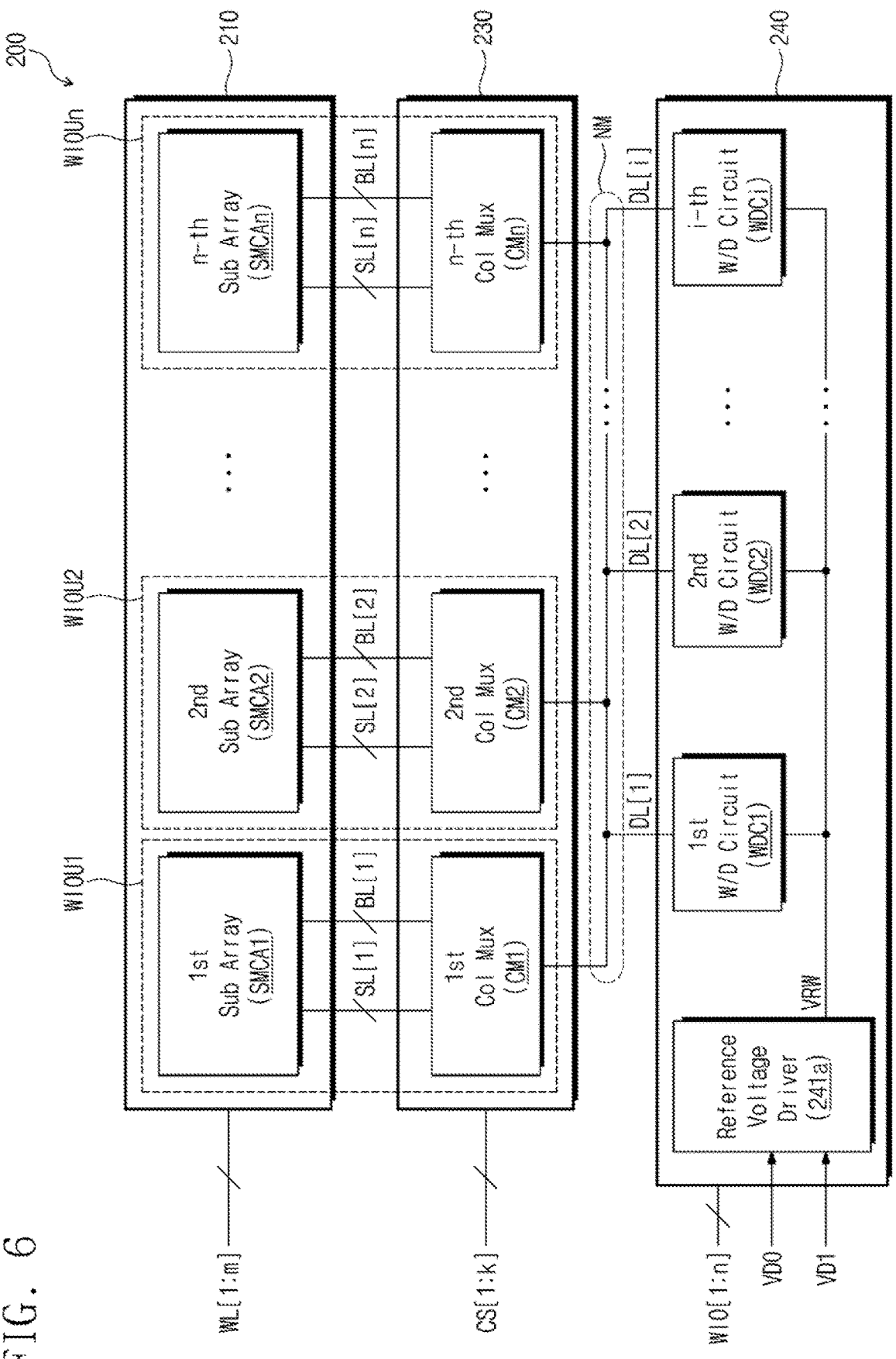
FIG. 6 is a block diagram illustrating a memory device according to an example embodiment.

FIG. 6 is a block diagram illustrating a memory device according to an example embodiment.

For brevity of illustration, components (e.g., a row decoder) that are unnecessary to describe the example embodiment of FIG. 6 are omitted. The description given with reference to FIG. 1 will be omitted to avoid redundancy.

Referring to FIGS. 1, 2, and 6, a memory device 200 may include a memory cell array 210, a column decoder 230, and a merged write driver 240.

The memory cell array 210 may include the plurality of sub memory cell arrays SMCA1 to SMCAn. In an example embodiment, each of the plurality of sub memory cell arrays SMCA1 to SMCAn may include a plurality of memory cells. Each of the plurality of sub memory cell arrays SMCA1 to SMCAn may be configured to store data provided through the write I/O WIO.

In an example embodiment, the plurality of sub memory cell arrays SMCA1 to SMCAn may be included in a respective write input/output unit (hereinafter referred to as a "write I/O unit"). For example, the first sub memory cell array SMCA1 may be included in a first write I/O unit WIOU1, the second sub memory cell array SMCA2 may be included in a second write I/O unit WIOU2, and the n-th sub memory cell array SMCAn may be included in an n-th write I/O unit WIOUn.

The plurality of sub memory cell arrays SMCA1 to SMCAn may be connected through the plurality of word lines WL1 to WLm. For example, the first word line WL1 may be connected with memory cells placed at a first row from among the memory cells of the plurality of sub memory cell arrays SMCA1 to SMCAn, the second word line WL2 may be connected with memory cells placed at a second row from among the memory cells of the plurality of sub memory cell arrays SMCA1 to SMCAn, and the m-th word line WLm may be connected with memory cells placed at an m-th row from among the memory cells of the plurality of sub memory cell arrays SMCA1 to SMCAn.

The plurality of sub memory cell arrays SMCA1 to SMCAn may receive a plurality of word line signals WL[1:m] through the plurality of word lines WL1 to WLm. For example, the first word line WL1 may correspond to the first word line signal WL[1], the second word line WL2 may correspond to the second word line signal WL[2], and the m-th word line WLm may correspond to the m-th word line signal WL[m]. A structure of the memory cell array 210 is similar to the structure described with reference to FIG. 2, and thus, additional description will be omitted to avoid redundancy.

The column decoder 230 may include a plurality of column multiplexers CM1 to CMn.

Each of the plurality of column multiplexers CM1 to CMn may be configured to select a corresponding source line and a corresponding bit line in response to column select signals CS[1:k]. The plurality of column multiplexers CM1 to CMn may be connected with a merged node NM. In an example embodiment, the plurality of column multiplexers CM1 to CMn may be included in a respective write I/O unit. For example, the first column multiplexer CM1 may be included in the first write I/O unit WIOU1, the second column multiplexer CM2 may be included in the second write I/O unit WIOU2, and the n-th column multiplexer CMn may be included in the n-th write I/O unit WIOUn.

The merged write driver 240 may include a reference voltage driver 241*a* and a plurality of write circuits WDC1 to WDCi. Herein, "i" may be a natural number of 2 or more. In an example embodiment, "i" may be less than "n".

The reference voltage driver 241*a* may generate a reference write voltage VRW based on data (hereinafter referred to as "write data") received through a corresponding write I/O (e.g., WIO[1]) of the plurality of write I/Os WIO[1:n].

In an example embodiment, write data may refer to data corresponding to one of "n" data bits.

The reference voltage driver 241*a* may receive the first driving voltage VD0 and the second driving voltage VD1 from the voltage generator 171 (refer to FIG. 1). The first driving voltage VD0 may correspond to data of a first value (e.g., logic "0"), and the second driving voltage VD1 may correspond to data of a second value (e.g., logic "1").

When write data have the first value (e.g., logic "0"), the reference voltage driver 241*a* may generate the reference write voltage VRW for writing the data of the first value (e.g., logic "0") based on the first driving voltage VD0.

In contrast, when write data have the second value (e.g., logic "1"), the reference voltage driver 241*a* may generate the reference write voltage VRW for writing the data of the second value (e.g., logic "1") based on the second driving voltage VD1.

A configuration and a function of the reference voltage driver 241*a* will be described in detail with reference to FIG. 7.

Each of the plurality of write circuits WDC1 to WDCi may output a write voltage based on the reference write voltage VRW. Levels of write voltages that the plurality of write circuits WDC1 to WDCi respectively output may not be uniform, e.g., a level of a write voltage that the first write circuit WDC1 outputs may be different from a level of a write voltage that the second write circuit WDC2 outputs.

The plurality of write circuits WDC1 to WDCi may be respectively connected with data lines DL[1] to DL[i], and may be connected with the merged node NM through the data lines DL[1] to DL[i]. Accordingly, the merged node NM may be connected with output terminals of the plurality of write circuits WDC1 to WDCi.

According to the present disclosure, regardless of the write I/O unit, a voltage level of the merged node NM may uniformly have a specific value (or may converge to the specific value) depending on a logical value (e.g., logic "0" or logic "1") of write data. According to the present disclosure, the influence due to a voltage distribution that write voltages respectively output by the plurality of write circuits WDC1 to WDCi form may be minimized.

In detail, by way of example, if "i" is "2", and a level of a write voltage that the first write circuit WDC1 outputs is 2.0 V and a level of a write voltage that the second write circuit WDC2 outputs is 1.8 V, then the merged node NM may have a voltage level of 1.9 V.

Each of the plurality of write circuits WDC1 to WDCi may control a voltage of the merged node NM such that write data are written in a memory cell corresponding to a bit line and a source line selected by the column decoder 230. Thus, each of the plurality of write circuits WDC1 to WDCi may apply a write voltage to a bit line and a source line selected by the column decoder 230 for the purpose of writing write data.

Because each of the plurality of write circuits WDC1 to WDCi is connected with the merged node NM, write circuits may not be classified in the write I/O unit. Thus, each of the plurality of write circuits WDC1 to WDCi may not constitute the write I/O units WIOU1 to WIOUn.

In an example embodiment, the number of plurality of write circuits WDC1 to WDCi may be less than the number of write I/O units WIOU1 to WIOUn. According to the present disclosure, write I/Os and write circuits may be matched in not a one-to-one correspondence but a one-to-N correspondence (N being a natural number of 1 or more and being different from n), and a write circuit utilized for one write I/O may be utilized for another write I/O. Thus, because a write circuit is not disposed every write I/O, the area in which write circuits are integrated may be decreased.

In view of the above, first write data provided through the first write I/O WIO[1] may be stored in memory cells included in the first sub memory cell array SMCA1 by the plurality of write circuits WDC1 to WDCi, second write data provided through the second write I/O WIO[2] may be stored in memory cells included in the second sub memory cell array SMCA2 by the plurality of write circuits WDC1 to WDCi, and n-th write data provided through the n-th write I/O WIO[n] may be stored in memory cells included in the n-th sub memory cell array SMCAn by the plurality of write circuits WDC1 to WDCi.

In another implementation (not illustrated), the merged node NM may include two nodes (e.g., a merged bit node and a merged source node). For example, the first write circuit WDC1 may be connected with the first data line DL[1], and the first data line DL[1] may include a first merged bit line and a first merged source line. The first merged bit line may be connected with the merged bit node, and the first merged source line may be connected with the merged source node. In this case, each of the plurality of column multiplexers CM1 to CMn may apply a voltage of the merged bit node to a selected bit line, and may apply a voltage of the merged source node to a selected source line.

In an example embodiment, the plurality of write circuits WDC1 to WDCi may receive n-bit data through the plurality of write I/Os WIO[1:n]. For example, the plurality of write circuits WDC1 to WDCi may receive the first data bit of the n-bit data through the write I/O WIO[1] and may receive the second data bit of the n-bit data through the write I/O WIO[2].

In this case, one of the plurality of write circuits (e.g., one of WDC1 to WDCi) may output a write voltage corresponding to each of the n-bit data to the merged node NM. Thus, a voltage of the merged node NM may correspond to each of the n-bit data. A voltage level of the merged node NM may uniformly have a specific value depending on a logical value of one data bit of the n-bit data.

In this case, the column decoder 230 may select "n" memory cells, in which the n-bit data are to be stored, from among the memory cells of the memory cell array 210. For example, the first column multiplexer CM1 may select a memory cell of the first sub memory cell array SMCA1 for the purpose of storing the first data bit. The first column multiplexer CM1 may apply a voltage of the merged node NM corresponding to the first data bit to the memory cell of the first sub memory cell array SMCA1. The second column multiplexer CM2 may select a memory cell of the second sub memory cell array SMCA2 for the purpose of storing the second data bit. The second column multiplexer CM2 may apply a voltage of the merged node NM corresponding to the second data bit to the memory cell of the second sub memory cell array SMCA2.

Figure 7:
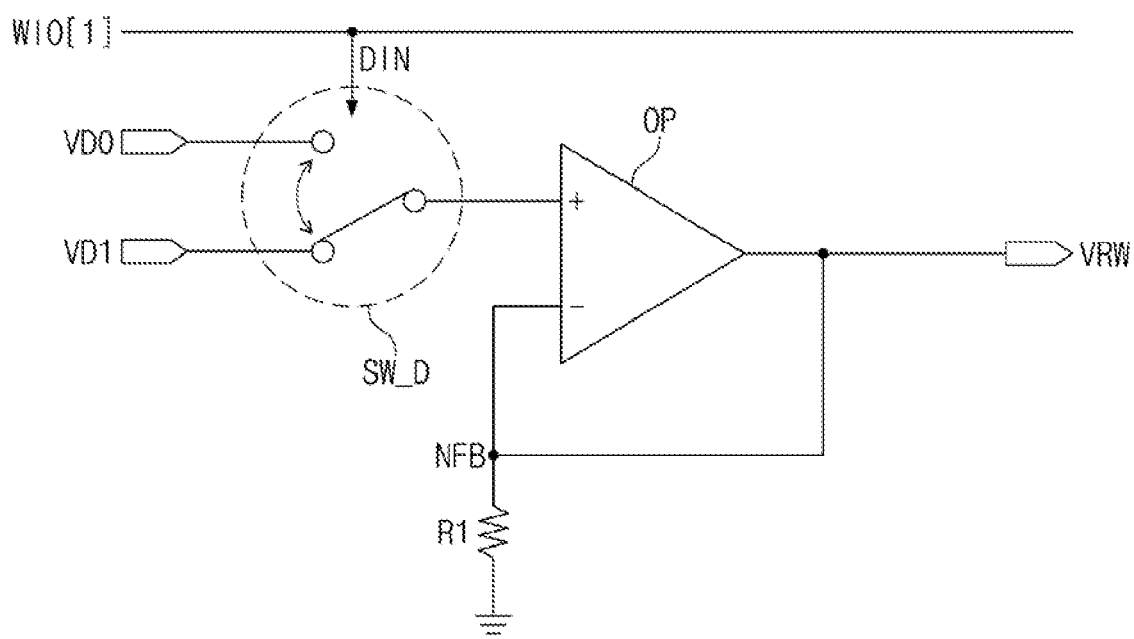
FIG. 7 is a circuit diagram illustrating a reference voltage driver of FIG. 6 in detail.

FIG. 7 is a circuit diagram illustrating a reference voltage driver of FIG. 6 in detail.

The reference voltage driver 241a may include a data switch SW_D, an operational amplifier OP, and a first resistor R1.

Referring to FIGS. 6 and 7, the data switch SW_D may select and output the first driving voltage VD0 or the second driving voltage VD1 in response to write data DIN provided through a write I/O (e.g., WIO[1]). For brevity of illustration, only the first write I/O WIO[1] of the plurality of write I/Os WIO[1:n] is illustrated.

In detail, by way of example, if the write data DIN have a first value (e.g., logic "0"), then the data switch SW_D may output the first driving voltage VD0. In contrast, if the write data DIN have a second value (e.g., logic "1"), then the data switch SW_D may output the second driving voltage VD1.

The operational amplifier OP may output the reference write voltage VRW based on the first driving voltage VD0 or the second driving voltage VD1.

The operational amplifier OP may include a first input terminal, a second input terminal, and an output terminal. In the operational amplifier OP, the first input terminal (e.g., a positive input terminal) may be connected with the data switch SW_D, the second input terminal (e.g., a negative input terminal) may be connected with a feedback node NFB, and the output terminal may be connected with an output pin outputting the reference write voltage VRW.

The reference write voltage VRW may be applied to the plurality of write circuits WDC1 to WDCi through the output terminal. Thus, the output terminal of the operational amplifier OP may be connected with the plurality of write circuits WDC1 to WDCi.

In another implementation (not illustrated), the operational amplifier OP may further include a positive power terminal and a negative power terminal, and separate bias voltages may be respectively applied to the positive power terminal and the negative power terminal.

The first resistor R1 may be connected between the feedback node NFB and a ground voltage terminal. A value of the first resistor R1 may be variable. A voltage of the feedback node NFB may correspond to a voltage that is obtained by decreasing the reference write voltage VRW depending on a value of the first resistor R1. The voltage of the feedback node NFB may be input to the second input terminal of the operational amplifier OP.

In another implementation (not illustrated), a second resistor may be further included between the output terminal of the operational amplifier OP and the feedback node NFB. In this case, the voltage of the feedback node NFB may be divided by the first resistor R1 and the second resistor so as to be input to the second input terminal of the operational amplifier OP.

The reference voltage driver 241a may trim the reference write voltage VRW through a feedback loop composed of the operational amplifier OP and the first resistor R1. In an example embodiment, the plurality of write circuits WDC1 to WDCi share the merged node NM, and thus efficiency in trimming the reference write voltage VRW may be improved.

Figure 8:
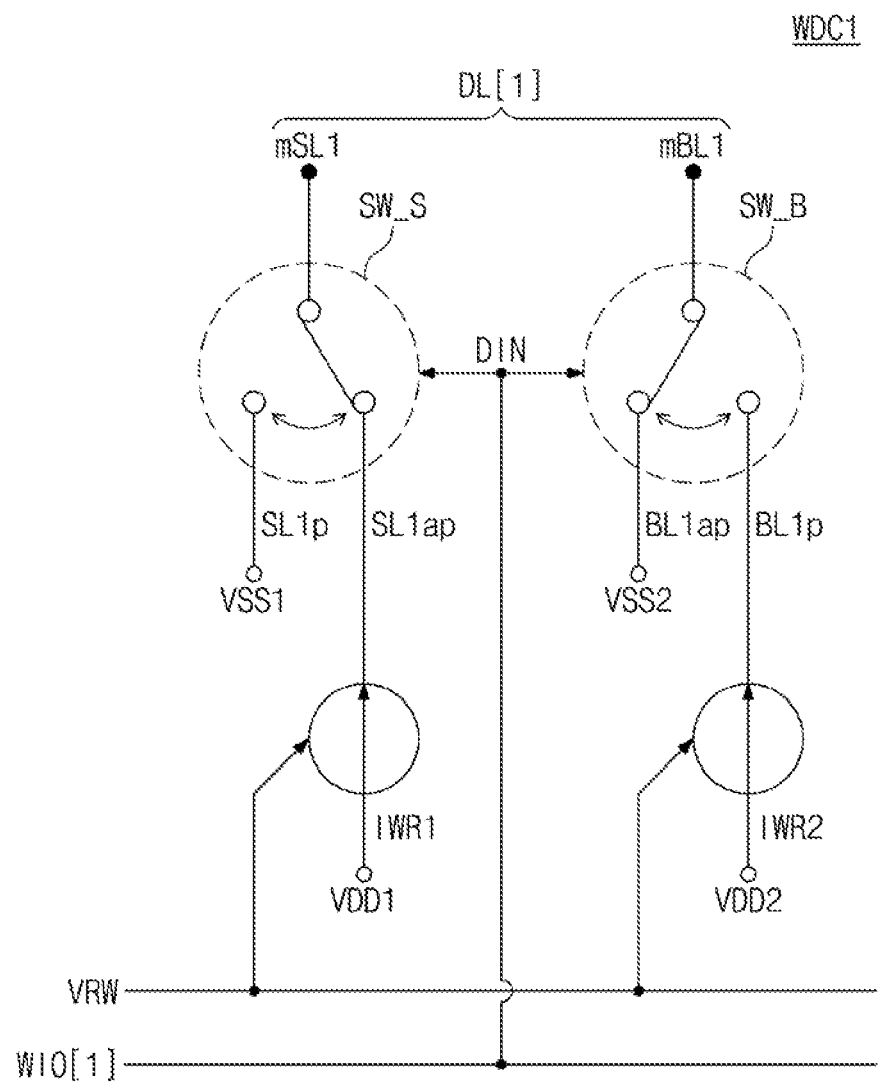
FIG. 8 is a circuit diagram illustrating a first write circuit of FIG. 6.

FIG. 8 is a circuit diagram illustrating a first write circuit of FIG. 6.

For convenience of description, only the first write circuit WDC1 of the plurality of write circuits WDC1 to WDCi is illustrated as an example, but it may be understood that configurations and functions of the remaining write circuits WDC2 to WDCi are substantially the same as a configuration and an operation of the first write circuit WDC1.

Referring to FIGS. 6 and 8, the first write circuit WDC1 may include a source line switch SW_S, a bit line switch SW_B, a first current source to generate a first write current IWR1, and a second current source to generate a second write current IWR2.

The source line switch SW_S may connect a first parallel source line SL1p or a first anti-parallel source line SL1ap with a first merged source line mSL1 in response to the write data DIN of the first write I/O WIO[1]. Thus, a voltage level of the first merged source line mSL1 may be a voltage level of the first parallel source line SL1p or a voltage level of the first anti-parallel source line SL1ap.

As in the above description, the bit line switch SW_B may connect a first parallel bit line BL1p or a first anti-parallel bit line BL1ap with a first merged bit line mBL1 in response to the write data DIN of the first write I/O WIO[1]. Thus, a voltage level of the first merged bit line mBL1 may be a voltage level of the first parallel bit line BL1p or a voltage level of the first anti-parallel bit line BL1ap.

For brevity of illustration, only the first write I/O WIO[1] of the plurality of write I/Os WIO[1:n] is illustrated.

The first current source may generate the first write current IWR1 based on a first power supply voltage VDD1. The first current source may provide the first write current IWR1 to the first anti-parallel source line SL1ap. Also, the first current source may generate the first write current IWR1 based on the reference write voltage VRW corresponding to the first value (e.g., logic "0").

Likewise, the second current source may generate the second write current IWR2 based on a second power supply voltage VDD2. The second current source may provide the second write current IWR2 to the first parallel bit line BL1p. Also, the second current source may generate the second write current IWR2 based on the reference write voltage VRW corresponding to the second value (e.g., logic "1").

The intensity of the first write current IWR1 or the second write current IWR2 may be adjusted based on the reference write voltage VRW.

According to the above description, each of the plurality of write circuits WDC1 to WDCi may generate write currents (e.g., IWR1 and IWR2) having different values. A data state of the memory cell MC (refer to FIG. 2) may depend on the write current IWR1 or IWR2.

The first parallel source line SL1*p* may refer to a line (e.g., a conducting line) between the source line switch SW_S and a first source voltage VSS1 terminal. A voltage level of the first parallel source line SL1*p* may correspond to a voltage level of the first source voltage VSS1.

The first anti-parallel source line SL1*ap* may refer to a line between the source line switch SW_S and a first terminal of the first current source. The first write current IWR1 may flow to the first anti-parallel source line SL1*ap*.

The first parallel bit line BL1*p* may refer to a line between the bit line switch SW_B and a first terminal of the second current source. The second write current IWR2 may flow to the first parallel bit line BL1*p*.

The first anti-parallel bit line BL1*ap* may refer to a line between the bit line switch SW_B and a second source voltage VSS2 terminal. A voltage level of the first anti-parallel bit line BL1*ap* may correspond to a voltage level of the second source voltage VSS2.

In an example embodiment, the first source voltage VSS1 and/or the second source voltage VSS2 may be a ground voltage.

When the write data DIN have the first value (e.g., logic "0"), the source line switch SW_S may connect the first merged source line mSL1 with the first anti-parallel source line SL1*ap*, and the bit line switch SW_B may connect the first merged bit line mBL1 with the first anti-parallel bit line BL1*ap*. In this case, a voltage level of the first anti-parallel source line SL1*ap* may be greater than a voltage level of the first anti-parallel bit line BL1*ap*.

In contrast, when the write data DIN have the second value (e.g., logic "1"), the source line switch SW_S may connect the first merged source line mSL1 with the first parallel source line SL1*p*, and the bit line switch SW_B may connect the first merged bit line mBL1 with the first parallel bit line BL1*p*. In this case, a voltage level of the first parallel bit line BL1*p* may be greater than a voltage level of the first parallel source line SL1*p*.

Figure 9:
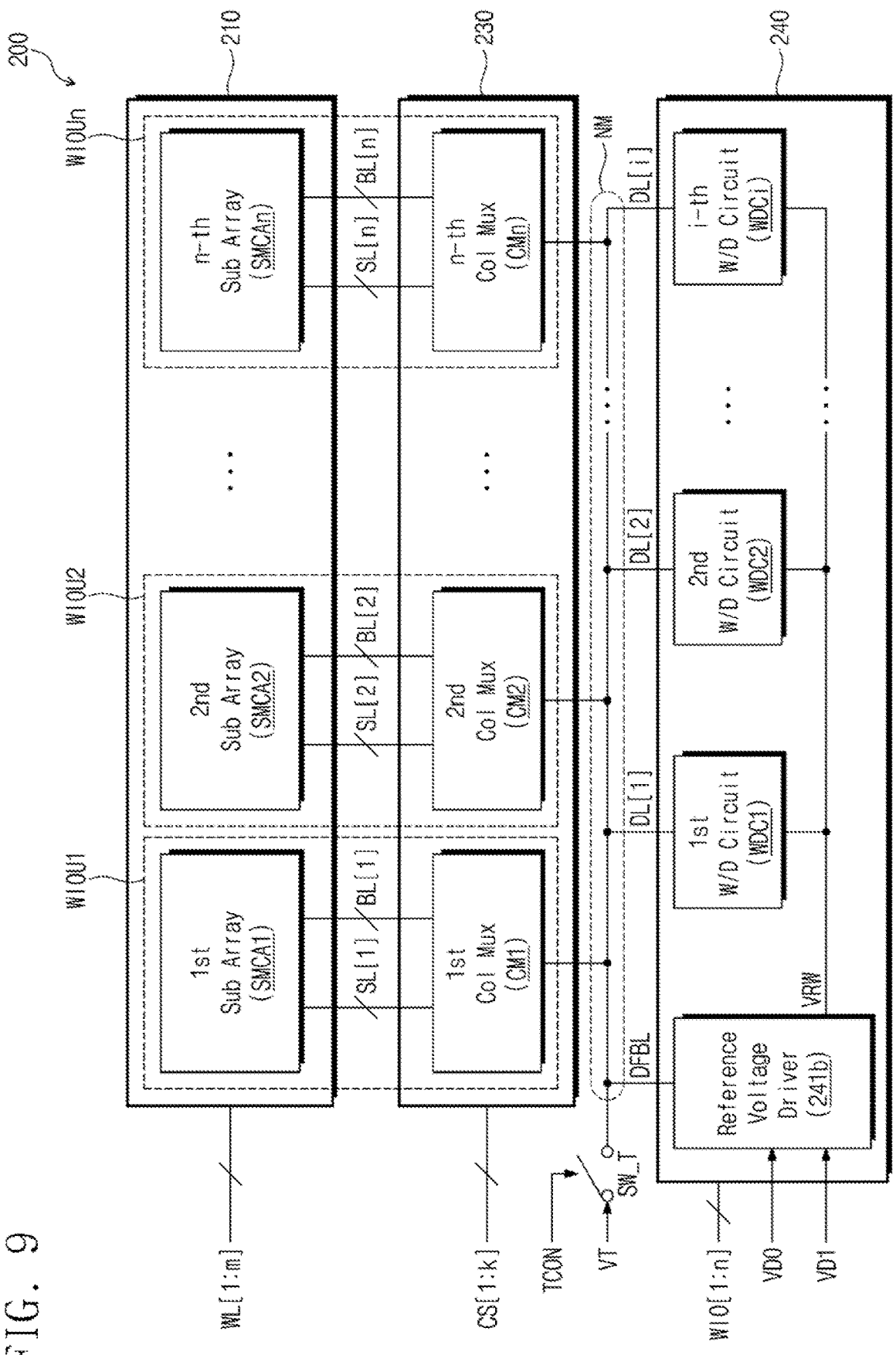
FIG. 9 is a block diagram illustrating a memory device according to an example embodiment.

FIG. 9 is a block diagram illustrating a memory device according to an example embodiment.

For convenience of description, the description given with reference to FIG. 6 will be omitted to avoid redundancy.

Referring to FIGS. 6 and 9, the memory device 200 may include a test switch SW_T. The test switch SW_T may provide an external test voltage VT to the merged node NM in response to a test control signal TCON.

In an example embodiment, the external test voltage VT may be applied to the memory device 200 before the shipment of the memory device 200. As the memory device 200 operates in a test mode, there may be calculated a voltage level of the merged node NM for appropriately storing requested data in the memory cell MC (refer to FIG. 2) and appropriately reading the data stored in the memory cell MC (refer to FIG. 2).

In an example embodiment, the test mode may be performed with the external test voltage VT applied only to the merged node NM, and thus the numbers of switches (e.g., SW_T) and lines used to operate in the test mode may be decreased.

The merged write driver 240 may include a reference voltage driver 241*b* that is directly connected with the merged node NM through a feedback line DFBL. The reference voltage driver 241*b* may trim the reference write voltage VRW through a direct feedback loop that is based on a voltage level of the merged node NM.

A configuration and a function of the reference voltage driver 241*b* will now be described in detail with reference to FIG. 10.

Figure 10:
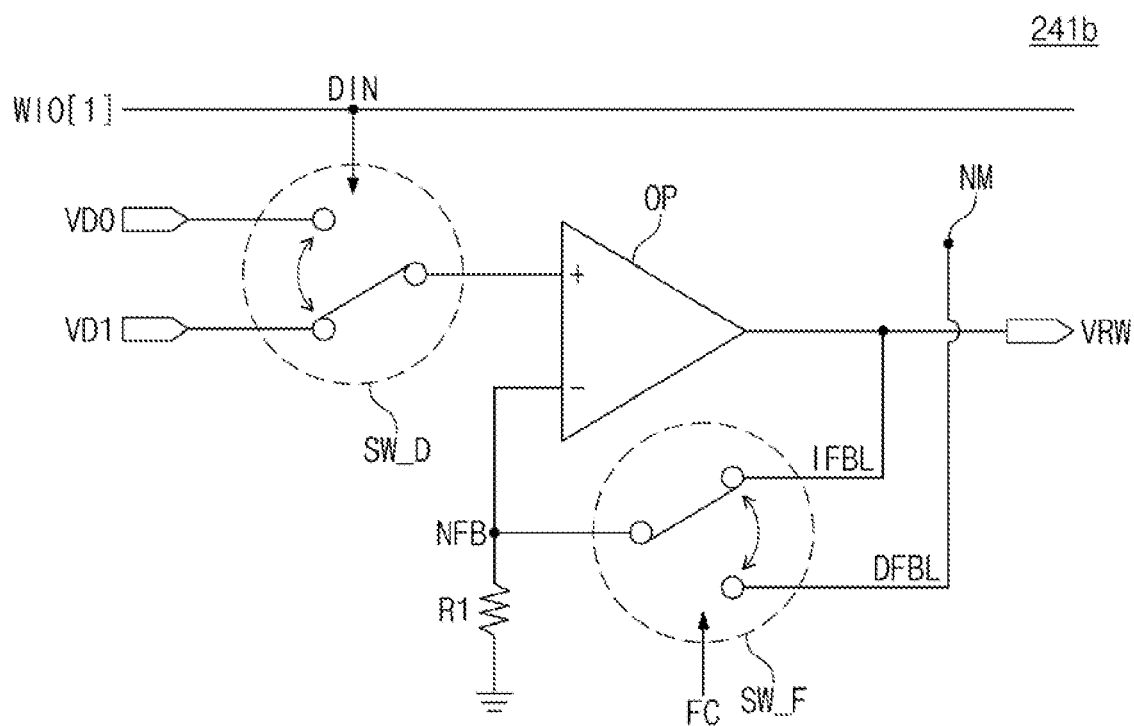
FIG. 10 is a circuit diagram illustrating a reference voltage driver of FIG. 9 in detail.

FIG. 10 is a circuit diagram illustrating a reference voltage driver of FIG. 9 in detail.

For convenience of description, the description given with reference to FIGS. 6, 7, and 9 will be omitted to avoid redundancy.

The reference voltage driver 241*b* may operate in a first feedback mode, in which the feedback is made based on the reference write voltage VRW, or in a second feedback mode, in which the feedback is made based on a voltage of the merged node NM.

The reference voltage driver 241*b* may include a feedback switch SW_F. The feedback switch SW_F may select a direct feedback line DFBL or an indirect feedback line IFBL in response to a feedback control signal FC.

The feedback control signal FC may be provided from the outside (e.g., the control logic 170 (refer to FIG. 1)).

When the reference voltage driver 241*b* operates in the first feedback mode, the feedback node NFB may be connected with the indirect feedback line IFBL. When the reference voltage driver 241*b* operates in the second feedback mode, the feedback node NFB may be connected with the direct feedback line DFBL.

According to an example embodiment, the plurality of write circuits WDC1 to WDCi may share the merged node NM, and thus the reference write voltage VRW may be trimmed by using output voltages of the plurality of write circuits WDC1 to WDCi.

According to an example embodiment, the feedback loop for trimming the reference write voltage VRW may be diversified, and thus a write voltage may be finely tuned.

Figure 11:
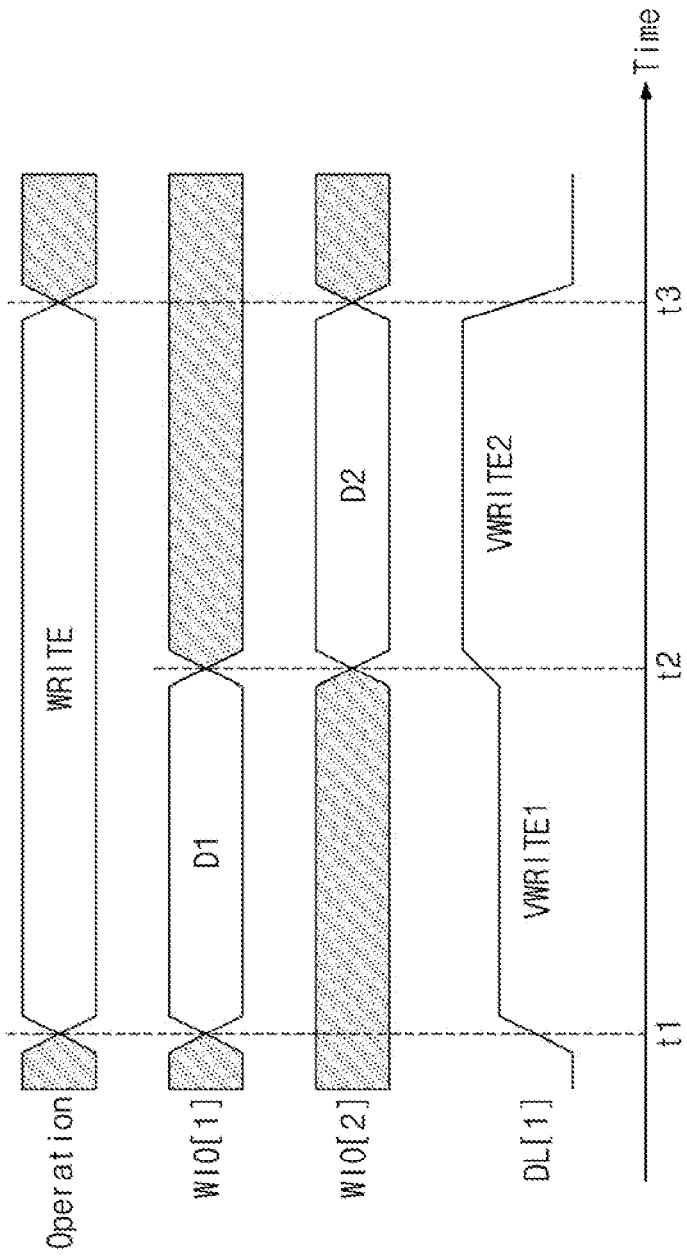
FIG. 11 is a timing diagram illustrating a write operation of a memory device of FIGS. 6 and 9.

FIG. 11 is a timing diagram illustrating a write operation of a memory device of FIGS. 6 and 9.

For convenience of description, the description given with reference to FIGS. 6 to 10 will be omitted to avoid redundancy.

Referring to FIGS. 6, 9, and 11, the memory device 200 may perform a write operation WRITE from a first point in time t1 to a third point in time t3. First write data D1 may correspond to the first value (e.g., logic "0"), and second write data D2 may correspond to the second value (e.g., logic "1"). In an example embodiment, write cycles for writing pieces of data received from the plurality of write I/Os WIO[1:n] may not overlap each other. According to the present disclosure, because write cycles for pieces of data having different logical values do not overlap each other, the memory device 200 including the merged node NM may be implemented.

In detail, at the first point in time t1, the merged write driver 240 may receive the first write data D1 through the first write I/O WIO[1]. Each of the plurality of write circuits WDC1 to WDCi may provide a first write voltage VWRITE1 corresponding to the first value (e.g., logic "0") to a data line (e.g., DL[1]) connected with the merged node NM. Thus, the first write voltage VWRITE1 may be applied to a bit line or a source line selected by the column decoder 230.

At the second point in time t2, the merged write driver 240 may not receive the first write data D1 any longer. The merged write driver 240 may receive the second write data D2 through the second write I/O WIO[2]. Each of the plurality of write circuits WDC1 to WDCi may provide a second write voltage VWRITE2 corresponding to the second value (e.g., logic "1") to a data line (e.g., DL[1]) connected with the merged node NM. Thus, the second write voltage VWRITE2 may be applied to a bit line or a source line selected by the column decoder 230.

For example, the description will be given under the case where the first write voltage VWRITE1 and the second write voltage VWRITE2 are applied to a selected bit line. A level of the first write voltage VWRITE1 may be lower than a level of a voltage applied to a selected source line. A level of the second write voltage VWRITE2 may be higher than a level of a voltage applied to a selected source line.

At the third point in time t3, the memory device 200 may not perform the write operation WRITE any longer. The merged write driver 240 may not receive the second write data D2 any longer.

Figure 12:
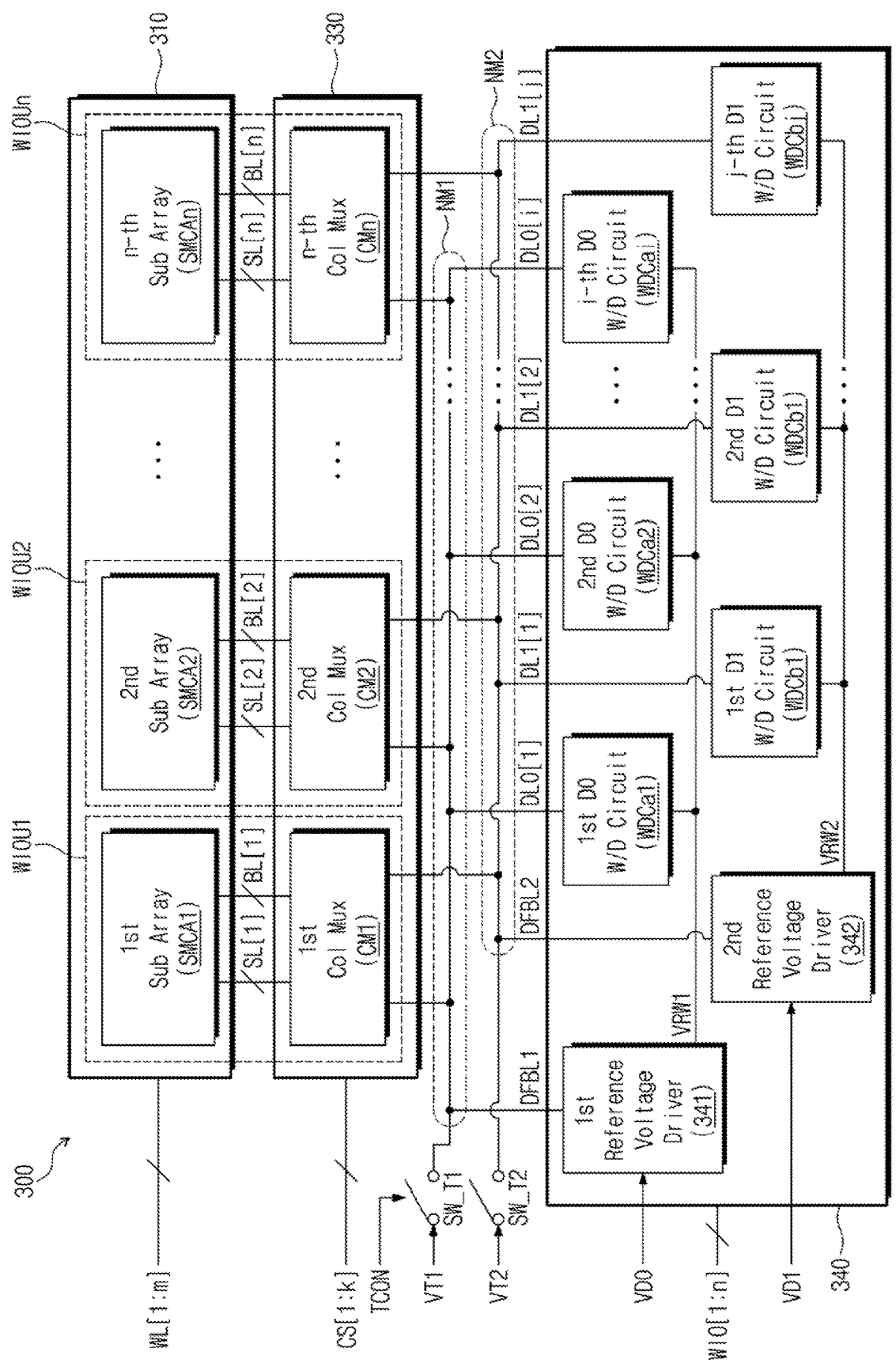
FIG. 12 is a block diagram illustrating a memory device according to an example embodiment.

FIG. 12 is a block diagram illustrating a memory device according to an example embodiment.

For convenience of description, the description given with reference to FIGS. 1, 6, and 9 will be omitted to avoid redundancy.

A memory device 300 may include a memory cell array 310, a column decoder 330, and a merged write driver 340.

Configurations and operations of the memory cell array 310 and the column decoder 330 are similar to the configurations and operations of the memory cell array 210 and the column decoder 230 of FIGS. 6 and 9, and thus, additional description will be omitted to avoid redundancy.

The merged write driver 340 may include a first reference voltage driver 341, a plurality of first value write circuits WDCa1 to WDCai, a second reference voltage driver 342, and a plurality of second value write circuits WDCb1 to WDCbj.

The merged write driver 340 may receive n-bit data through the plurality of write I/Os WIO[1:n]. Herein, "i" and "j" may be the same natural number or different natural numbers. In an example embodiment, "i" and "j" may be less than "n".

The first reference voltage driver 341 may generate a first reference write voltage VRW1 for writing data of the first value (e.g., logic "0") based on the first driving voltage VD0. The first reference voltage driver 341 may receive the first driving voltage VD0 from the voltage generator 171 (refer to FIG. 1). The first driving voltage VD0 may correspond to data of the first value (e.g., logic "0").

The second reference voltage driver 342 may generate a second reference write voltage VRW2 for writing data of the second value (e.g., logic "1") based on the second driving voltage VD1. The second reference voltage driver 342 may receive the second driving voltage VD1 from the voltage generator 171 (refer to FIG. 1). The second driving voltage VD1 may correspond to data of the second value (e.g., logic "1").

Each of the plurality of first value write circuits WDCa1 to WDCai may output a first write voltage based on the first reference write voltage VRW1. When the number of first value write circuits is 2 or more, levels of first write voltages that the first value write circuits WDCa1 to WDCai respectively output may not be uniform. The first value write circuits WDCa1 to WDCai may be respectively connected with data lines DL0[1] to DL0[i], and may be connected with a first merged node NM1 through the data lines DL0[1] to DL0[i]. Accordingly, levels of first write voltages that the first value write circuits WDCa1 to WDCai respectively output may be different from each other, but a voltage level of the first merged node NM1 may uniformly have a specific value.

Likewise, each of the plurality of second value write circuits WDCb1 to WDCbj may output a second write voltage based on the second reference write voltage VRW2. When the number of second value write circuits is 2 or more, levels of second write voltages that the second value write circuits WDCb1 to WDCbj respectively output may not be uniform. The second value write circuits WDCb1 to WDCbj may be respectively connected with data lines DL1[1] to DL1[i] and may be connected with a second merged node NM2 through the data lines DL1[1] to DL1[i]. Accordingly, levels of second write voltages that the second value write circuits WDCb1 to WDCbj respectively output may be different from each other, but a voltage level of the second merged node NM2 may uniformly have a specific value.

According to an example embodiment, each of the plurality of first value write circuits WDCa1 to WDCai may control a voltage of the first merged node NM1, and thus first write data of the first value (e.g., logic "0") may be written in a memory cell corresponding to a bit line and a source line selected by the column decoder 330. Thus, each of the plurality of first value write circuits WDCa1 to WDCai may apply the first write voltage to a bit line and a source line selected by the column decoder 330 for the purpose of writing the first write data.

Likewise, each of the plurality of second value write circuits WDCb1 to WDCbj may control a voltage of the second merged node NM2, and thus second write data of the second value (e.g., logic "1") may be written in a memory cell corresponding to a bit line and a source line selected by the column decoder 330. Thus, each of the plurality of second value write circuits WDCb1 to WDCbj may apply the second write voltage to a bit line and a source line selected by the column decoder 330 for the purpose of writing the second write data.

First and second value write circuits may not be classified in the write I/O unit. In an example embodiment, the number of the plurality of first value write circuits WDCa1 to WDCai and the number of the plurality of second value write circuits WDCb1 to WDCbj may be less than the number of write I/O units WIOU1 to WIOUn.

In another implementation (not illustrated), each of the first and second merged nodes NM1 and NM2 may include two nodes (e.g., a merged bit node and a merged source node).

The memory device 300 may include a first test switch SW_T1 and a second test switch SW_T2. The first test switch SW_T1 may provide a first external test voltage VT1 to the first merged node NM1 in response to the test control signal TCON. Likewise, the second test switch SW_T2 may provide a second external test voltage VT2 to the second merged node NM2 in response to the test control signal TCON. In an example embodiment, the first and second external test voltages VT1 and VT2 may be applied to the memory device 300 before the shipment of the memory device 300. As the memory device 300 operates in a test mode, there may be calculated voltage levels of the first and second merged nodes NM1 and NM2 for appropriately storing requested data in the memory cell MC (refer to FIG. 2) and appropriately reading the data stored in the memory cell MC (refer to FIG. 2).

The first reference voltage driver 341 may be connected with the first merged node NM1 through a first direct feedback line DFBL1. The first reference voltage driver 341 may trim the first reference write voltage VRW1 through a direct feedback loop that is based on a voltage level of the first merged node NM1. Likewise, the second reference voltage driver 342 may be connected with the second merged node NM2 through a second direct feedback line DFBL2. The second reference voltage driver 342 may trim the second reference write voltage VRW2 through a direct feedback loop that is based on a voltage level of the second merged node NM2.

Figure 13:
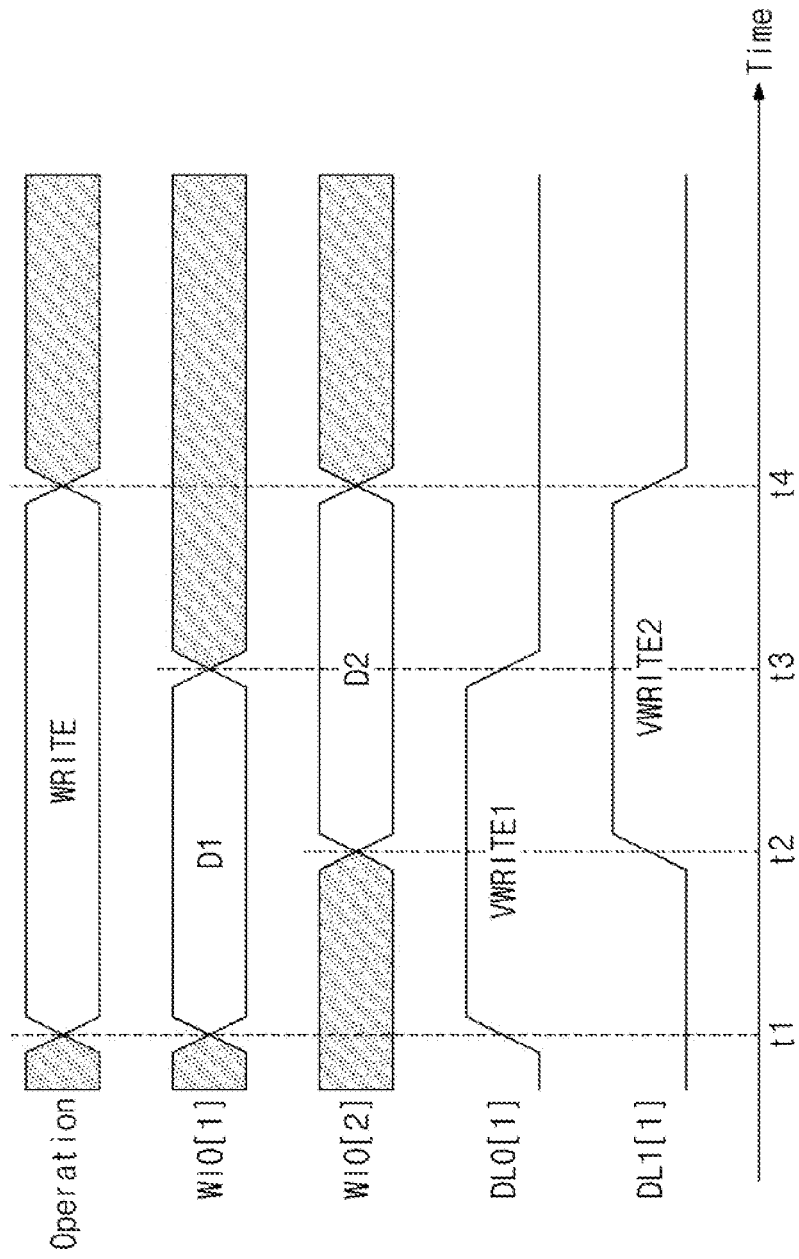
FIG. 13 is a timing diagram illustrating a write operation of a memory device of FIG. 12.

FIG. 13 is a timing diagram illustrating a write operation of a memory device of FIG. 12.

For convenience of description, the description given with reference to FIGS. 11 to 12 will be omitted to avoid redundancy.

Referring to FIGS. 12 and 13, the memory device 300 may perform the write operation WRITE from a first point in time t1 to a fourth point in time t4. The first write data D1 may correspond to the first value (e.g., logic "0"), and the second write data D2 may correspond to the second value (e.g., logic "1"). In an example embodiment, write cycles for writing the data D1 and D2 having different logical values may overlap each other. In an example embodiment, merged nodes (respectively corresponding to data having different logical values) may be separate from each other, and thus write cycles may overlap each other.

In detail, at the first point in time t1, the merged write driver 340 may receive the first write data D1 corresponding to the first value (e.g., logic "0") through the first write I/O WIO[1]. Each of the plurality of first value write circuits WDCa1 to WDCai may provide the first write voltage VWRITE1 corresponding to the first value (e.g., logic "0") to a data line (e.g., DL0[1]) connected with the first merged node NM1. Thus, the first write voltage VWRITE1 may be applied to a bit line or a source line selected by the column decoder 330.

At the second point in time t2, the merged write driver 340 may be receiving the first write data D1. The merged write driver 340 may receive the second write data D2 corresponding to the second value (e.g., logic "1") through the second write I/O WIO[2]. Each of the plurality of second value write circuits WDCb1 to WDCbj may provide the second write voltage VWRITE2 corresponding to the second value (e.g., logic "1") to a data line (e.g., DL1[1]) connected with the second merged node NM2. Thus, the second write voltage VWRITE2 may be applied to a bit line or a source line selected by the column decoder 330.

At the third point in time t3, the merged write driver 340 may be receiving the second write data D2. The merged write driver 340 may not receive the first write data D1 any longer.

At the fourth point in time t4, the memory device 300 may not perform the write operation WRITE any longer. The merged write driver 340 may not receive the second write data D2 any longer.

Figure 14:
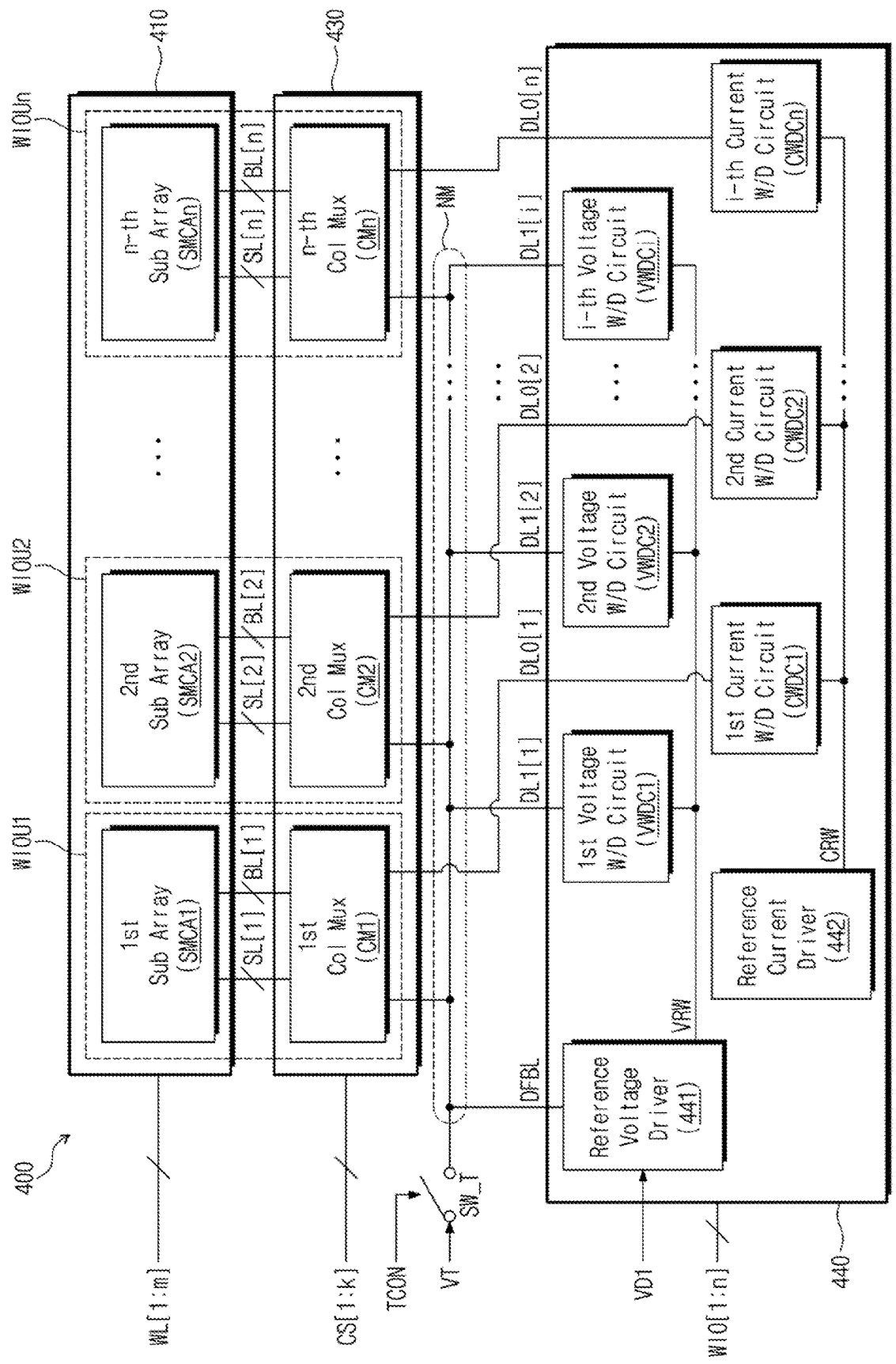
FIG. 14 is a block diagram illustrating a memory device according to an example embodiment.

FIG. 14 is a block diagram illustrating a memory device according to an example embodiment.

For convenience of description, the description given with reference to FIGS. 1, 6, 9, and 12 will be omitted to avoid redundancy.

A memory device 400 may include a memory cell array 410, a column decoder 430, a merged write driver 440, and the test switch SW_T.

Configurations and operations of the memory cell array 410, the column decoder 430, and the test switch SW_T are similar to the configurations and operations of the memory cell array 310, the column decoder 330, and the second test switch SW_T2 of FIG. 12, and thus, additional description will be omitted to avoid redundancy.

The merged write driver 440 may include a reference voltage driver 441, a plurality of voltage write circuits VWDC1 to VWDCi, a reference current driver 442, and a plurality of current write circuits CWDC1 to CWDCn. In an example embodiment, "i" may be less than "n".

Configurations and functions of the reference voltage driver 441 and the plurality of voltage write circuits VWDC1 to VWDCi are similar to the configurations and functions of the second reference voltage driver 342 and the plurality of second value write circuits WDCb1 to WDCbj of FIG. 12, and thus, additional description will be omitted to avoid redundancy.

The reference current driver 442 may generate a reference write current CRW. The plurality of current write circuits CWDC1 to CWDCn may receive pieces of first write data through first write I/Os WIO1. Each of the plurality of current write circuits CWDC1 to CWDCn may output a write current for writing the first value (e.g., logic "0") based on the first write data and the reference write current CRW.

In an example embodiment, the plurality of current write circuits CWDC1 to CWDCn may be included in respective ones of the write I/O units. For example, the first current write circuit CWDC1 may be included in the first write I/O unit WIOU1, the second current write circuit CWDC2 may be included in the second write I/O unit WIOU2, and the n-th current write circuit CWDCn may be included in the n-th write I/O unit WIOUn.

In an example embodiment, each of the plurality of current write circuits CWDC1 to CWDCn may provide a write current, and thus first write data of the first value (e.g., logic "0") may be written in a memory cell corresponding to a bit line and a source line selected by the column decoder 430. Thus, each of the plurality of current write circuits CWDC1 to CWDCn may apply a write current to a bit line and a source line selected by the column decoder 430 for the purpose of writing first write data.

Figure 15:
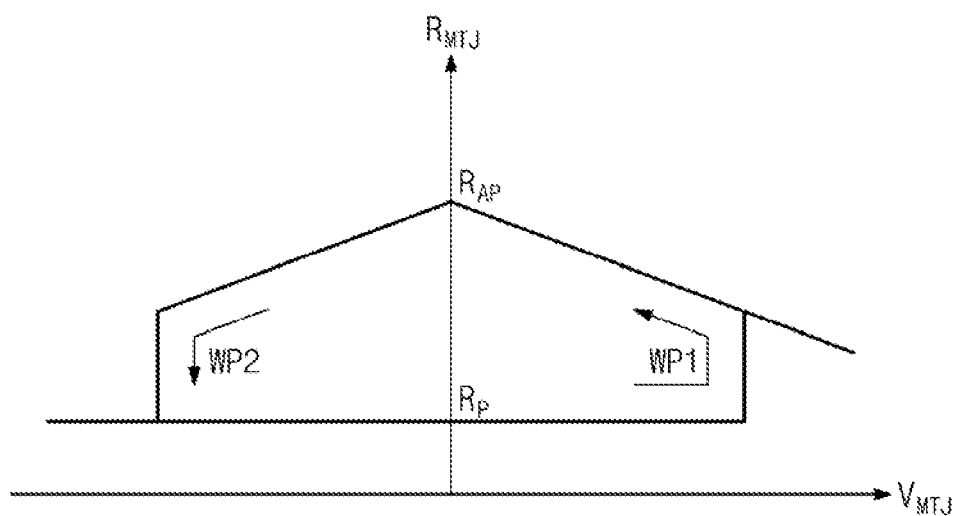
FIG. 15 is a graph illustrating a resistance value of an MTJ element of a memory device of FIG. 14.

FIG. 15 is a graph illustrating a resistance value of an MTJ element of a memory device of FIG. 14.

Referring to FIGS. 2, 14, and 15, the memory cell array 410 may include the memory cell MC, and the memory cell MC may include an MTJ element.

In FIG. 15, an x-axis represents a level of a voltage (VMTJ) applied to one side of the MTJ element, and a y-axis represents a resistance value (RMTJ) of the MTJ element. Also, Rp represents a resistance value in the case where the MTJ element is in a parallel state, and RAP indicates a resistance value in the case where the MTJ element in in anti-parallel state.

First, in the case where a resistance value of the MTJ element is Rp, the memory cell MC may be regarded as storing data of the first value (e.g., logic "0").

Next, the case of changing and storing data stored in the memory cell MC to data of the second value (e.g., logic "1") is assumed. The reference voltage driver 441 may generate the reference write voltage VRW. Each of the plurality of voltage write circuits VWDC1 to VWDCi may output a write voltage to the merged node NM. A voltage of the merged node NM may be applied to a bit line and/or a source line corresponding to the memory cell MC. Thus, a current may flow from a source line corresponding to the MTJ element to a bit line corresponding to the MTJ element. As such, a magnetization direction of the free layer FL may be opposite to a magnetization direction of the pinned layer PL, and thus, the MTJ element may be programmed to have a large resistance value. The process in which the MTJ element is programmed to have a large resistance value is expressed by a first write path WP1 of FIG. 15. A resistance value of the MTJ element may change to RAP through the first write path WP1.

Next, the case of changing and storing data stored in the memory cell MC to data of the first value (e.g., logic "0") is assumed. The reference current driver 442 may generate the reference write current CRW. A current write circuit (e.g., CWDC1) may output a write current from a bit line corresponding to the memory cell MC to a source line corresponding to the memory cell MC. As such, a magnetization direction of the free layer FL may be the same as a magnetization direction of the pinned layer PL, and thus, the MTJ element may be programmed to have a small resistance value. The process in which the MTJ element is programmed to have a small resistance value is expressed by a second write path WP2 of FIG. 15. A resistance value of the MTJ element may change to $R_P$ through the second write path WP2.

A resistance value of the MTJ element changes from a small value to a large value through the first write path WP1. According to Ohm's Law, because a resistance value increases with a voltage of the merged node NM maintained, a level of a current flowing to the MTJ element may decrease. Likewise, a resistance value of the MTJ element changes from a large value to a small value through the second write path WP2. According to an example embodiment, although a resistance value decreases in the second write path WP2, a level of a write current may be uniformly output. Accordingly, the reliability of the MTJ element may be improved. According to an example embodiment, regardless of the write path, a current level or electric energy may be consistently maintained, and thus the memory device 400 may operate more efficiently.

According to an example embodiment, the influence due to a voltage distribution that write voltages output by write circuits form may be minimized. According to an example embodiment, the area in which the write circuits are integrated may be decreased. According to an example embodiment, efficiency in trimming a reference write voltage may be improved.

According to an example embodiment, switches and lines used to operate in a test mode may decrease in number. According to an example embodiment, the reliability of an MTJ element may be improved.

By way of summation and review, an MRAM may include a variable resistance element (or a magnetic tunnel junction (MTJ)). A magnetization direction of the MTJ may change depending on a direction of a current applied to the MTJ, and a resistance value of the MTJ may vary depending on the magnetization direction of the MTJ. The MRAM may store (write) or read data by using the above characteristic of the MTJ.

A general implementation of an MRAM may perform a write operation through an individual write driver for each write input/output (I/O), such that the individual write driver may output a write voltage corresponding to a logical value; in this case, write voltages that the write drivers output may form a distribution. Even if a write voltage is adjusted by trimming a reference write voltage, it may not be possible to completely adjust, e.g., eliminate, the distribution of the write voltages.

As described above, embodiments relate to a memory device including a merged write driver that allows write voltages of write circuits to be output to one node. Embodiments may provide a memory device including a merged write driver capable of decreasing a write voltage distribution through a merged node.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
 a memory cell array including a first sub memory cell array including a first memory cell and a second sub memory cell array including a second memory cell;
 a merged write driver including a first write circuit configured to receive n-bit data (n being a natural number of 2 or more) through a write input/output line, to output a first write voltage to a merged node in response to a first data bit of the n-bit data, and to output a second write voltage to the merged node in response to a second data bit of the n-bit data; and
 a column decoder including a first column multiplexer configured to apply a first voltage of the merged node corresponding to the first data bit to the first memory cell, and including a second column multiplexer configured to apply a second voltage of the merged node corresponding to the second data bit to the second memory cell.

2. The memory device as claimed in claim 1, wherein each of the first and second memory cells includes:
 a cell transistor including a first terminal connected with a source line, and a gate electrode connected with a word line; and
 a magnetic tunnel junction (MTJ) element including a first terminal connected with a second terminal of the cell transistor, and a second terminal connected with a bit line.

3. The memory device as claimed in claim 1, wherein the merged write driver further includes a second write circuit configured to receive the n-bit data through the write input/output line, to output a third write voltage to the merged node in response to the first data bit, and to output a fourth write voltage to the merged node in response to the second data bit.

4. The memory device as claimed in claim 3, wherein:
 a level of the first voltage is formed by the first write voltage and the third write voltage, and
 a level of the second voltage is formed by the second write voltage and the fourth write voltage.

5. The memory device as claimed in claim 1, wherein the merged write driver further includes a reference voltage driver configured to receive a first driving voltage or a second driving voltage, and to generate a reference write voltage based on the first driving voltage or the second driving voltage.

6. The memory device as claimed in claim 5, wherein:
 the reference voltage driver includes:
 a data switch configured to select and output the first driving voltage or the second driving voltage in response to write data corresponding to one data bit of the n-bit data;
 an operational amplifier including a first input terminal connected with the data switch, a second input terminal connected with a feedback node, and an output terminal connected with the first write circuit, and configured to generate the reference write voltage; and a first resistor connected between the feedback node and a ground voltage terminal, and the write data have a first value or a second value.

7. The memory device as claimed in claim 6, wherein:
the reference voltage driver further includes a feedback switch configured to select a first line or a second line in response to a feedback control signal, the first line is connected with the output terminal of the operational amplifier, and the second line is connected with the merged node, and the reference voltage driver operates in a first feedback mode in which a feedback based on the reference write voltage is made through the first line, or in a second feedback mode in which a feedback based on a voltage of the merged node is made through the second line.

8. The memory device as claimed in claim 6, wherein:
when the write data have the first value, the data switch selects the first driving voltage, and the operational amplifier generates the reference write voltage based on the first driving voltage, and when the write data have the second value, the data switch selects the second driving voltage, and the operational amplifier generates the reference write voltage based on the second driving voltage.

9. The memory device as claimed in claim 6, wherein the first write circuit includes:
a source line switch configured to connect a first parallel source line or a first anti-parallel source line with a first merged source line in response to the write data;

a bit line switch configured to connect a first parallel bit line or a first anti-parallel bit line with a first merged bit line in response to the write data;

a first current source configured to generate a first write current based on a first power supply voltage, and to provide the first write current to the first anti-parallel source line; and a second current source configured to generate a second write current based on a second power supply voltage, and to provide the second write current to the first parallel bit line.

10. The memory device as claimed in claim 9, wherein:
the first current source is configured to generate the first write current in response to the reference write voltage corresponding to the first value, and the second current source is configured to generate the second write current in response to the reference write voltage corresponding to the second value.

11. The memory device as claimed in claim 9, wherein:
when the write data have the first value, the source line switch connects the first anti-parallel source line with the first merged source line, and the bit line switch connects the first anti-parallel bit line with the first merged bit line, and when the write data have the second value, the source line switch connects the first parallel source line with the first merged source line, and the bit line switch connects the first parallel bit line with the first merged bit line.

12. The memory device as claimed in claim 11, wherein:
when the write data have the first value, a voltage level of the first anti-parallel source line is greater than a voltage level of the first anti-parallel bit line, and when the write data have the second value, a voltage level of the first parallel bit line is greater than a voltage level of the first parallel source line.

13. The memory device as claimed in claim 1, further comprising a test switch configured to provide an external test voltage to the merged node in response to a test control signal.

14. The memory device as claimed in claim 1, wherein, when a logical value of the first data bit is different from a logical value of the second data bit, a write operation is performed such that a first write cycle for writing the first data bit and a second write cycle for writing the second data bit do not overlap each other.

15. A memory device, comprising:
a memory cell array including a first sub memory cell array including a first memory cell and a second sub memory cell array including a second memory cell;

a column decoder including a first column multiplexer configured to apply a first voltage of a first merged node corresponding to a first value or a second voltage of a second merged node corresponding to a second value to the first memory cell, and including a second column multiplexer configured to apply the first voltage of the first merged node corresponding to the first value or the second voltage of the second merged node corresponding to the second value to the second memory cell; and a merged write driver configured to receive n-bit data (n being a natural number of 2 or more) through a write input/output line, and to provide the column decoder with the first voltage or the second voltage in response to the n-bit data, the merged write driver including:
first write circuits each configured to output a first write voltage to the first merged node in response to a first data bit corresponding to the first value from among the n-bit data; and second write circuits each configured to output a second write voltage to the second merged node in response to a second data bit corresponding to the second value from among the n-bit data.

16. The memory device as claimed in claim 15, wherein each of the first and second memory cells includes:
a cell transistor including a first terminal connected with a source line, and a gate electrode connected with a word line; and a magnetic tunnel junction (MTJ) element including a first terminal connected with a second terminal of the cell transistor, and a second terminal connected with a bit line.

17. The memory device as claimed in claim 15, wherein:
a level of the first voltage is formed by first write voltages that the first write circuits respectively output, and a level of the second voltage is formed by second write voltages that the second write circuits respectively output.

18. The memory device as claimed in claim 15, wherein:
the merged write driver further includes:
a first reference voltage driver configured to receive a first driving voltage, and to generate a first reference write voltage based on the first driving voltage; and a second reference voltage driver configured to receive a second driving voltage, and to generate a second reference write voltage based on the second driving voltage, each of the first write circuits generates the first write voltage based on the first reference write voltage, and each of the second write circuits generates the second write voltage based on the second reference write voltage.

19. The memory device as claimed in claim 15, further comprising:
   a first test switch configured to provide a first external test voltage to the first merged node in response to a test control signal; and
   a second test switch configured to provide a second external test voltage to the second merged node in response to the test control signal.

20. A memory device, comprising:
   a memory cell array including a first sub memory cell array including a first memory cell and a second sub memory cell array including a second memory cell;
   a column decoder including a first column multiplexer configured to provide a first current corresponding to a first value or a first voltage of a first merged node corresponding to a second value to the first memory cell, and including a second column multiplexer configured to provide a second current corresponding to the first value or the first voltage of the first merged node corresponding to the second value to the second memory cell; and
   a merged write driver configured to receive n-bit data (n being a natural number of 2 or more) through a write input/output line, and to provide the column decoder with the first current, the second current, or the first voltage in response to the n-bit data, the merged write driver including:
      a first current write circuit configured to provide the first current to the first column multiplexer in response to a first data bit corresponding to the first value from among the n-bit data;
      a second current write circuit configured to provide the second current to the second column multiplexer in response to a second data bit corresponding to the first value from among the n-bit data; and
      a second write circuit configured to output a write voltage to a second merged node in response to a third data bit corresponding to the second value from among the n-bit data.

\* \* \* \* \*